(12) United States Patent
Kao et al.

(10) Patent No.: US 11,296,051 B2
(45) Date of Patent: Apr. 5, 2022

(54) SEMICONDUCTOR PACKAGES AND FORMING METHOD THEREOF

(71) Applicant: Taiwan Semiconductor Manufacturing Co., Ltd., Hsinchu (TW)

(72) Inventors: Chin-Fu Kao, Taipei (TW); Chih-Yuan Chien, Hsinchu County (TW); Li-Hui Cheng, New Taipei (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/547,609

(22) Filed: Aug. 22, 2019

(65) Prior Publication Data

US 2021/0057384 A1    Feb. 25, 2021

(51) Int. Cl.
| | |
|---|---|
| *H01L 25/065* | (2006.01) |
| *H01L 23/367* | (2006.01) |
| *H01L 23/31* | (2006.01) |
| *H01L 23/538* | (2006.01) |
| *H01L 21/48* | (2006.01) |
| *H01L 23/00* | (2006.01) |
| *H01L 21/56* | (2006.01) |

(52) U.S. Cl.
CPC ...... *H01L 25/0657* (2013.01); *H01L 21/4853* (2013.01); *H01L 21/568* (2013.01); *H01L 23/3121* (2013.01); *H01L 23/367* (2013.01); *H01L 23/5389* (2013.01); *H01L 24/32* (2013.01); *H01L 21/561* (2013.01); *H01L 2224/32055* (2013.01); *H01L 2225/0652* (2013.01)

(58) Field of Classification Search
None
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |

(Continued)

*Primary Examiner* — Alexander G Ghyka
(74) *Attorney, Agent, or Firm* — JCIPRNET

(57) ABSTRACT

Semiconductor packages and methods of forming the same are provided. One of the semiconductor packages includes a first semiconductor die, an adhesive layer, a second semiconductor die and an underfill. The first semiconductor die includes a first surface, and the first surface includes a central region and a peripheral region surrounding the central region. The adhesive layer is adhered to the peripheral region and exposes the central region. The second semiconductor die is stacked over the first surface of the first semiconductor die. The underfill is disposed between the first semiconductor die and the second semiconductor die.

20 Claims, 22 Drawing Sheets

(56) References Cited

U.S. PATENT DOCUMENTS

| | | | |
|---|---|---|---|
| 2015/0116968 A1* | 4/2015 | Yamada | H01L 23/49822 361/767 |
| 2016/0027950 A1* | 1/2016 | Liu | H01L 31/109 438/69 |
| 2016/0260684 A1* | 9/2016 | Zhai | H01L 21/568 |
| 2018/0301418 A1* | 10/2018 | Chang Chien | H01L 21/4857 |
| 2018/0308785 A1* | 10/2018 | Vadhavkar | H01L 24/32 |
| 2019/0214366 A1* | 7/2019 | Chen | H01L 21/76898 |

* cited by examiner

SEMICONDUCTOR PACKAGES AND FORMING METHOD THEREOF

BACKGROUND

In the packaging of integrated circuits, semiconductor dies may be packaged by a molding compound, and may be bonded to other package components such as interposers and package substrates. Heat dissipation is a challenge in the semiconductor packages. There exists a bottleneck in efficiently dissipating the heat generated in the inner dies of the semiconductor packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
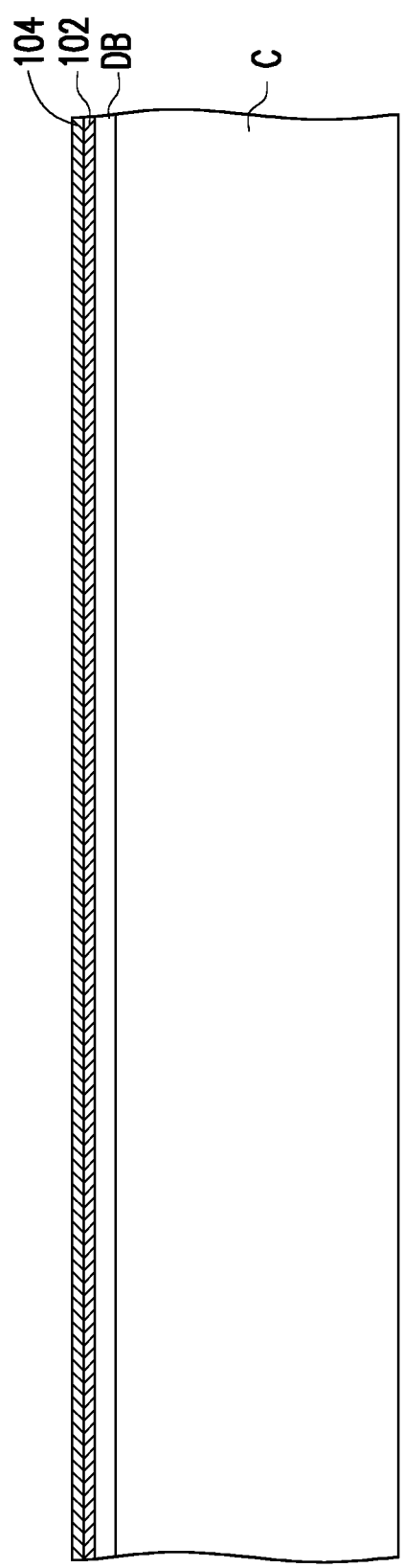
FIG. 1A to FIG. 1L are schematic cross-sectional views of a method of forming a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution circuit structure or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1L are schematic cross-sectional views of a method of forming a semiconductor package in accordance with some embodiments. FIG. 2 is a simplified top view of FIG. 1J. For simplicity and clarity of illustration, only few elements such as an amorphous layer of a semiconductor die and an adhesive layer are shown in FIG. 2.

Figure 2:
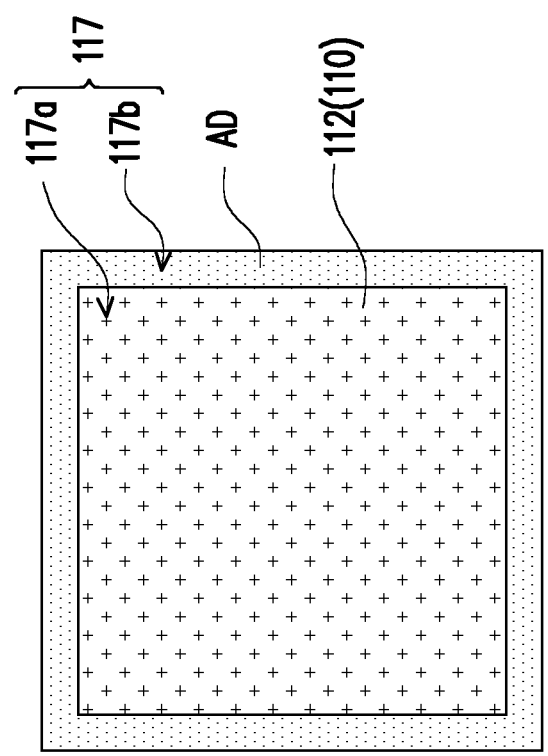
FIG. 2 is a simplified top view of FIG. 1J.

Referring to FIG. 1A, a carrier C with a de-bonding layer DB coated thereon is provided. In some embodiments, the carrier C may be a glass carrier, a ceramic carrier, a metal carrier or any suitable carrier for carrying a semiconductor wafer or a reconstituted wafer for the manufacturing method of the semiconductor package. In some embodiments, the de-bonding layer DB may be any material suitable for bonding and debonding the carrier C from the above layers or wafer disposed thereon. The de-bonding layer DB includes, for example, a light-to-heat conversion ("LTHC") layer, and such layer enables debonding from the carrier by applying laser irradiation. In some alternative embodiments, a buffer layer may be formed between the de-bonding layer DB and the temporary carrier C. The buffer layer may include a dielectric material layer made of a dielectric material including benzocyclobutene ("BCB"), polybenzoxazole ("PBO"), or any other suitable polymer-based dielectric material.

Then, a seed material layer is formed on the carrier C. In some embodiments, the seed material layer may be a composite layer including a plurality of seed layers. For example, a seed layer 102 is blanketly formed over the carrier C, and then a seed layer 104 is blanketly formed on the seed layer 102. A metal of the seed layer 102 is different from a metal of the seed layer 104. The seed layer 102 may be a titanium layer, and the seed layer 104 may be a copper layer. The seed layer 102, 104 may be formed by a deposition process such as a physical vapor deposition (PVD), a sputtering process or the like. In some embodiments, a thickness of the seed layer 102, 104 is in a range of 0.01 µm to 2 µm.

Figure 1B:
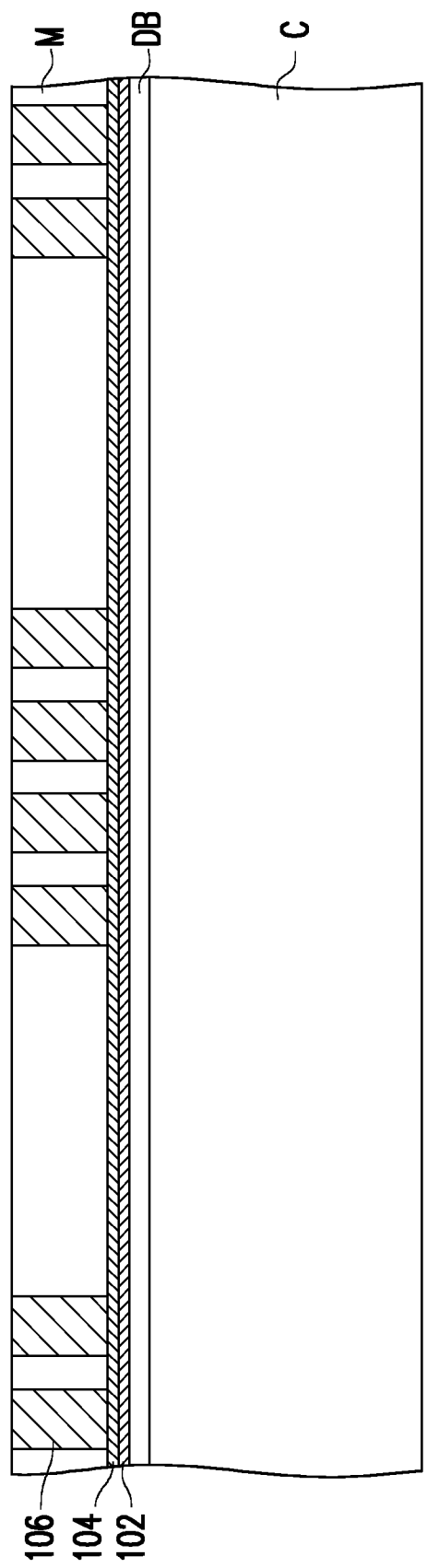

Referring to FIG. 1B, a mask M is formed over the seed layer 104. The mask M has a plurality of openings OP. The openings OP expose portions of the seed layer 104. The mask M is a photoresist layer, for example.

Then, a plurality of conductive patterns 106 are formed in the openings OP. In some embodiments, the conductive patterns 106 are formed by an electrochemical plating (ECP), an electroplating, an electroless plating or the like. In some embodiments, a material of the conductive patterns 106 includes aluminum, titanium, copper, nickel, tungsten, and/or alloys thereof.

Figure 1C:
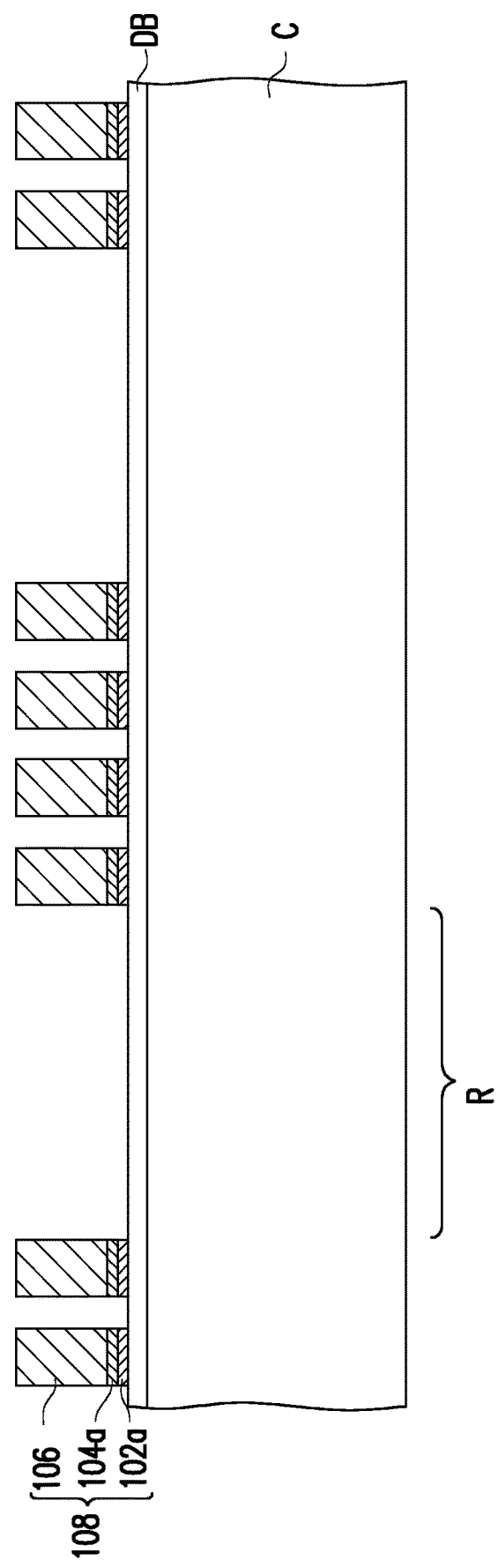

Referring to FIG. 1C, the mask M is removed, and portions of the seed layer 104 are exposed. In some embodiments, the mask M is removed by a stripping process. Then, a plurality of seed layer patterns 102a, 104a are formed by removing the exposed seed layer 104 and the seed layer 102 therebeneath. In some embodiments, the exposed seed layer 104 and the underlying seed layer 102 are removed by an etching process.

After removing the exposed seed layers 102, 104, a plurality of conductive pillars 108 are formed. The conductive pillars 108 surround a die region R in which a semiconductor die is then disposed. In some embodiments, the conductive pillar 108 includes the seed layer pattern 102a, the seed layer pattern 104a on the seed layer pattern 102a and the conductive pattern 106 on the seed layer pattern 104a. In some embodiments, a sidewall of the conductive pattern 106 is flush with sidewalls of the seed layer patterns 102a, 104a.

Figure 1D:
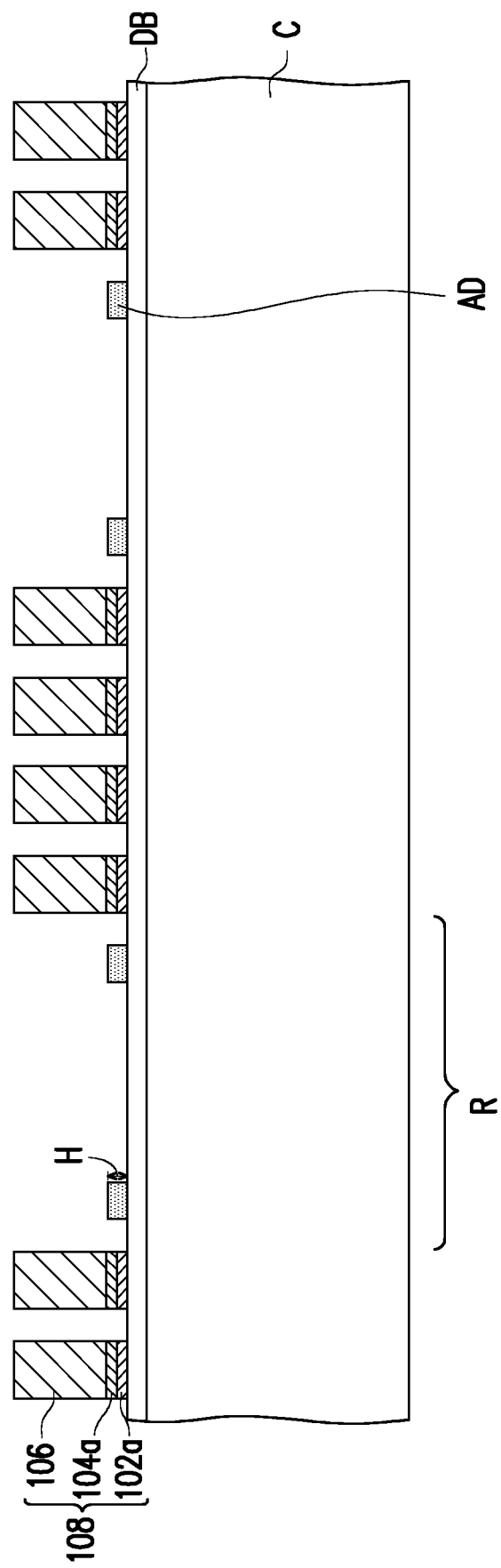

Referring to FIGS. 1D and 2, an adhesive layer AD is formed in the die region R between the conductive pillars 108. In some embodiments, the adhesive layer AD is also referred as a die attach film (DAF) or a film over wire (FOW). A material of the adhesive layer AD has a thermal conductivity k less than 1 w/mK, for example. The adhesive layer AD may include epoxy, polyimide, or the like. The adhesive layer AD has a ring shape such as a rectangular-ring shape (as shown in FIG. 2), a circle-ring shape (not shown) or a polygon-ring shape depending on the shape of the die and/or requirements. or the like. The adhesive layer AD completely surrounds and exposes a portion of the carrier C in the die region R. The adhesive layer AD may be formed by a dispensing process and a curing process. For example, a liquid material of the adhesive layer AD is dispensed by an inkjet printer or a dispenser and irradiated in-situ by a UV-light source along a rectangular-ring path (not shown) in the die region R, so as to form the ring-shaped adhesive layer AD. In some embodiments, a height H of the adhesive layer AD is in a range of 0.5 µm to 50 µm. In some embodiments, the ring shape is a rectangular-ring shape. In some embodiments, the adhesive layer AD is continuously formed on the carrier C to form a ring. However, the disclosure is not limited thereto. In some alternative embodiments, the adhesive layer AD may be discontinuously dispensed and formed as a plurality of discrete patterns.

Figure 1E:
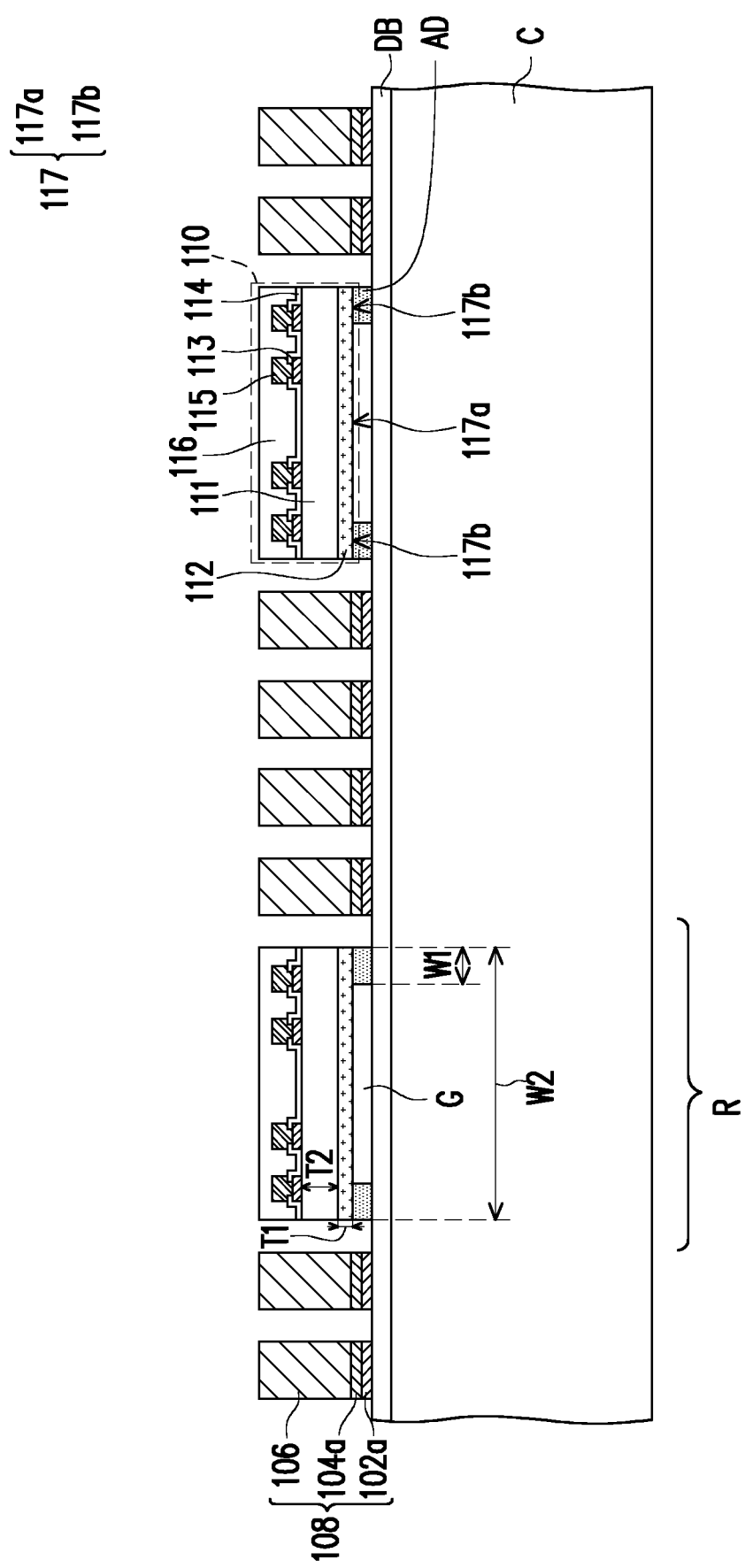

Referring to FIG. 1E, a semiconductor die 110 is picked and placed on the adhesive layer AD in the die region R over the carrier C. The semiconductor die 110 is adhered to the carrier C through the adhesive layer AD. The semiconductor die 110 is surrounded by the conductive pillars 108. In some embodiments, the semiconductor die 110 may be a digital chip, an analog chip or a mixed signal chip, such as an application-specific integrated circuit ("ASIC") chip, a sensor chip, a wireless and radio frequency chip, a memory chip, a logic chip, a voltage regulator chip, a system on chip (SoC) or any other suitable chip. In some embodiments, the semiconductor die 110 includes a substrate 111 having an amorphous layer 112 thereon, a plurality of pads 113 distributed on an active surface (not shown) of the substrate 111, a passivation layer 114 covering the active surface, a plurality of metal posts 115 and a protection layer 116. The substrate 111 includes a first may be a semiconductor substrate, such as a silicon substrate, although it may be formed of other semiconductor materials including, and not limited to, silicon germanium, silicon carbon, gallium arsenide, or the like. In some embodiments, the amorphous layer 112 is formed at the backside surface of the substrate 111 during performing a grinding process on the substrate to reduce the thickness of the substrate. The substrate 111 is a polysilicon layer, and the amorphous layer 112 is an amorphous silicon layer, for example. A thickness T1 of the amorphous layer 112 is less than a thickness T2 of the substrate 111. The thickness T1 of the amorphous layer 112 may be in a range of 6 nm to 39 nm. The thickness T2 of the substrate 111 may be in a range of 200 µm to 800 µm. The amorphous layer 112 may protect the substrate 111 from being damaged.

The semiconductor die 110 may include a device layer formed in or on the substrate 111. In some embodiments, the device layer may include transistors, resistors, capacitors, inductors, and/or the like. The pads 113 may be formed on and electrically connected to the device layer and may be pads of an interconnect structure. The pads 113 are partially exposed by the passivation layer 114, and the metal posts 115 are disposed on and electrically connected to the pads 113. The pads 113 are aluminum contact pads, for example. The metal posts 115 are copper posts or copper alloy posts, for example. The protection layer 116 covers the metal posts 115 and the passivation layer 114. In some alternative embodiments, before placing the semiconductor die 110 on the carrier C, the metal posts 115 are uncovered (i.e., bare dies not molded or encapsulated). In some embodiments, the protection layer 116 is a polymer layer. For example, the protection layer 116 includes a photo-sensitive material such as PBO, polyimide, BCB, a combination thereof, or the like.

In some embodiments, a front surface of the semiconductor die 110 is not coplanar with the top surfaces of the conductive pillars 108. In some embodiments, the top surface of the semiconductor die 110 is lower than the top surfaces of the conductive pillars 108, for example. In some alternative embodiments, the top surface of the semiconductor die 110 may be substantially flush with or higher than the top surfaces of the conductive pillars 108.

In some embodiments, a backside surface 117 (i.e., opposite to the front surface) of the semiconductor die 110 is also a surface of the amorphous layer 112. The backside surface 117 is in contact with the adhesive layer AD. The backside surface 117 includes a central region 117a and a peripheral region 117b surrounding the central region 117a. The adhesive layer AD is disposed at the peripheral region 117b and exposed the central region 117a. A width W1 of the adhesive layer AD is less than a width W2 of the semiconductor die 110. In some embodiments, the width W1 is in a range of 2 µm to 5000 µm. In some embodiments, after the semiconductor die 110 is placed on the adhesive layer AD, a gap G is formed between the amorphous layer 112 and the debonding layer DB. A height of the gap G is substantially the same as the thickness of the adhesive layer AD.

Figure 1F:
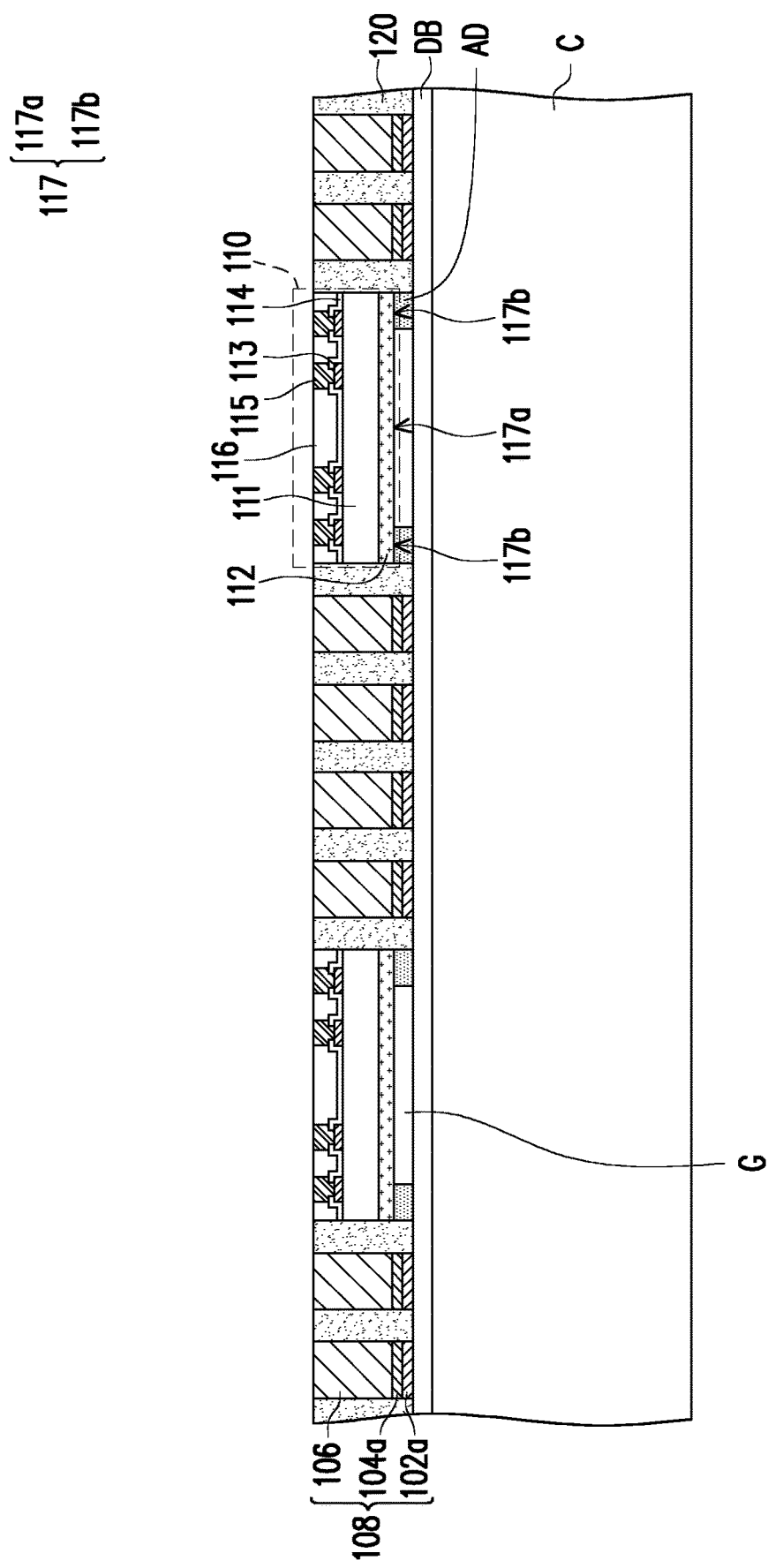

Referring to FIG. 1F, an encapsulant 120 is formed over the carrier C to encapsulate the semiconductor die 110 and the conductive pillars 108. In some embodiments, the encapsulant 120 covers the debond layer DB and fills among the semiconductor die 110 and the conductive pillars 108. In some embodiments, the encapsulant 120 is disposed among the semiconductor die 110 and the conductive pillars 108. In some embodiments, the encapsulant 120 laterally encapsulates the semiconductor die 110, that is, sidewalls of the semiconductor die 110 is encapsulated by the encapsulant 120. In some embodiments, a material of the encapsulant 120 is formed by forming a molding material covering the top surfaces of the semiconductor die 110 and the conductive pillars 108 by an over-molding process, and then removing portions of the material of the encapsulant 120 by a planarization process to expose the top surfaces of the semiconductor die 110 and the conductive pillars 108. In some embodiments, the planarization process for planarizing the material of the encapsulant 120, the semiconductor die 110 and the conductive pillars 108 includes a fly cut process, a grinding process, a chemical mechanical polishing ("CMP") process or any other suitable process. In some embodiments, portions of the protection layer 116 of the semiconductor die 110 and the conductive pillars 108 are also removed by the planarization process. In some embodiments, a top surface of the encapsulant 120 is substantially coplanar and flush with the top surfaces of the protection layer 116 and the metal posts 115 of the semiconductor die 110 and the conductive pillars 108. In some embodiments, the conductive pillars 108 penetrate and are embedded the encapsulant 120. In some embodiments, the encapsulant 120 includes a molding compound, a molding underfill, a resin such as epoxy, a photo-sensitive material such as PBO, polyimide, BCB, a combination thereof, or the like.

In some embodiments, the encapsulant 120 encapsulates and is in contact with the outer sidewall of the adhesive layer AD. Since the gap G between the semiconductor die 110 and the debond layer DB is surrounded and sealed by the adhesive layer AD, the gap G remains empty without the encapsulant 120.

Figure 1G:
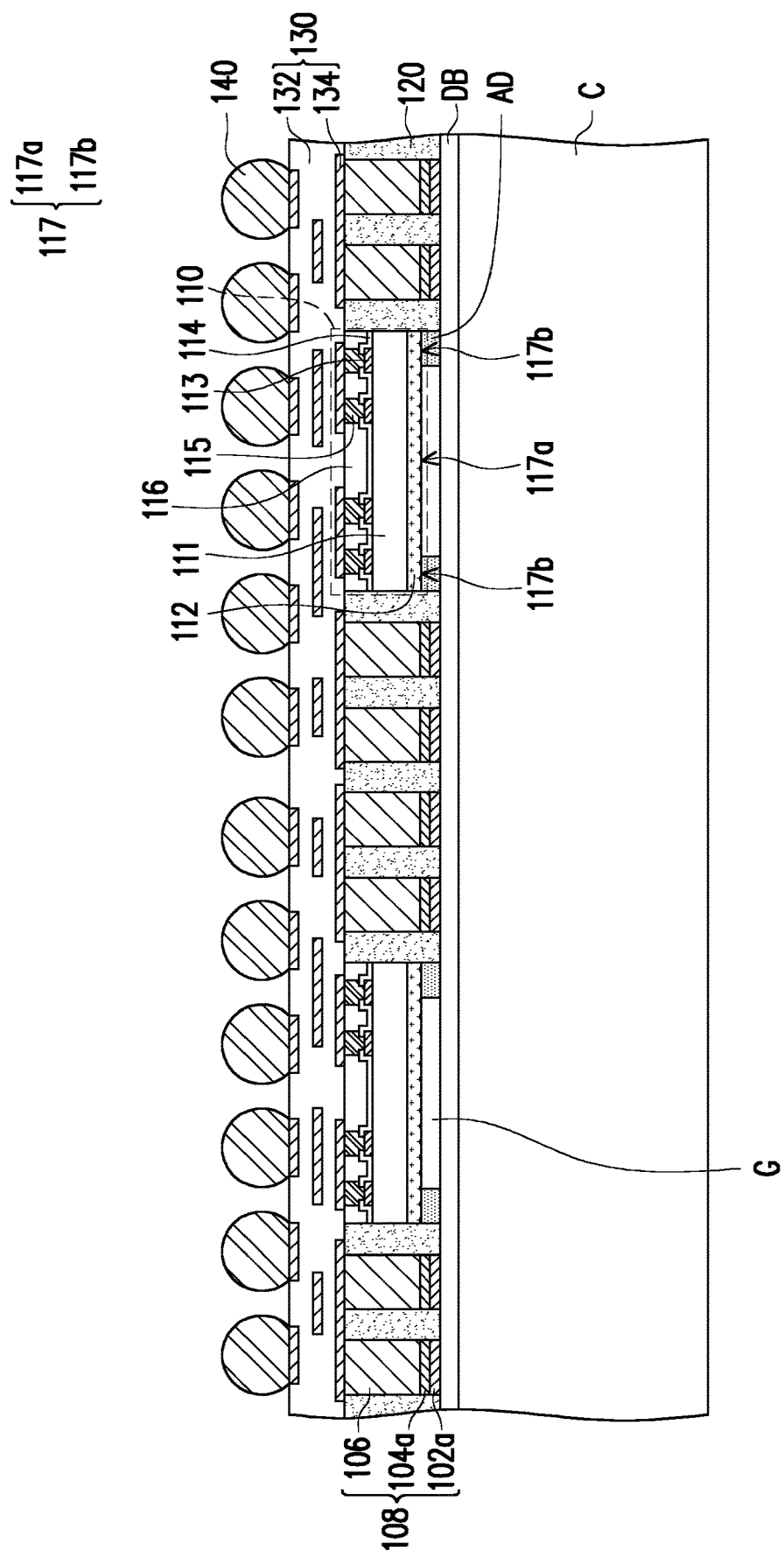

Referring to FIG. 1G, a redistribution circuit structure 130 is formed over the encapsulant 120, the semiconductor die 110 and the conductive pillars 108. In some embodiments, the redistribution circuit structure 130 is formed over the top surfaces of the encapsulant 120, the semiconductor die 110 and the conductive pillars 108. In some embodiments, the redistribution circuit structure 130 includes a dielectric layer 132 and a plurality of redistribution patterns 134 in the dielectric layer 132. In some embodiments, the bottom redistribution pattern 134 of the redistribution circuit structure 130 is in contact with the conductive pillars 108 and the metal posts 115 of the semiconductor die 110, for example. In some embodiments, the material of the redistribution patterns 134 includes aluminum, titanium, copper, nickel, tungsten, silver and/or alloys thereof. In some embodiments, the material of the dielectric layer 132 includes polyimide, benzocyclobutene, or polybenzooxazole. In some embodiments, the dielectric layer 132 may be a single or multiple layer structure. In some embodiments, the redistribution circuit structure 130 is a front-side redistribution circuit structure electrically connected to the semiconductor die 110 and is electrically connected to the conductive pillars 108. In some embodiments, as the underlying encapsulant 120 provides better planarization and evenness, the later-formed redistribution circuit structure 130, especially the redistribution pattern 134 with thin line width or tight spacing, can be formed with uniform line-widths or even profiles over the flat and level encapsulant 120, resulting in improved line/wiring reliability.

In some embodiments, a plurality of terminal connectors 140 are disposed on and electrically connected to the redistribution circuit structure 130. In some embodiments, prior to disposing terminal connectors 140, flux may be applied so that terminal connectors 140 are better fixed to top redistribution patterns 134 of the redistribution circuit structure 130, and the top redistribution patterns 134 may function as contact pads for terminal connectors 140. In some embodiments, terminal connectors 140 are, for example, solder balls or ball grid array ("BGA") balls placed on the redistribution circuit structure 130 and the top redistribution patterns 134 underlying the conductive elements 146 functions as ball pads. In some embodiments, the terminal connectors 140 are electrically connected to the semiconductor die 110 and the conductive pillars 108 through the redistribution circuit structure 130.

Figure 1H:
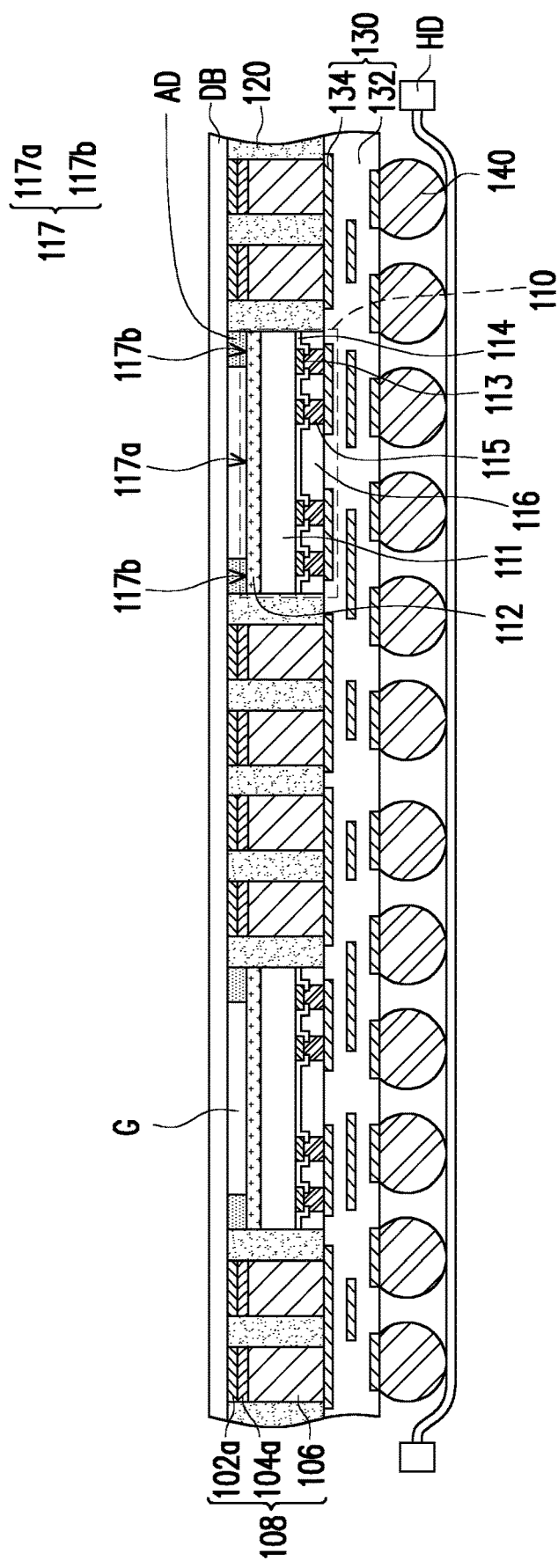

Referring to FIG. 1H, in some embodiments, the carrier C is detached and removed from the overlying structure. In some embodiments, the structure shown in FIG. 1G is overturned (e.g., turned upside down) and placed on a holder HD such as a frame tape for the de-bonding process of the carrier C. For example, the de-bonding layer DB (e.g., LTHC release layer) is irradiated with a UV laser, so that the carrier C and the de-bonding layer DB are easily peeled off from the underlying structure. Nevertheless, the de-bonding process is not limited thereto, and other suitable de-bonding methods may be used in some alternative embodiments.

Figure 1I:
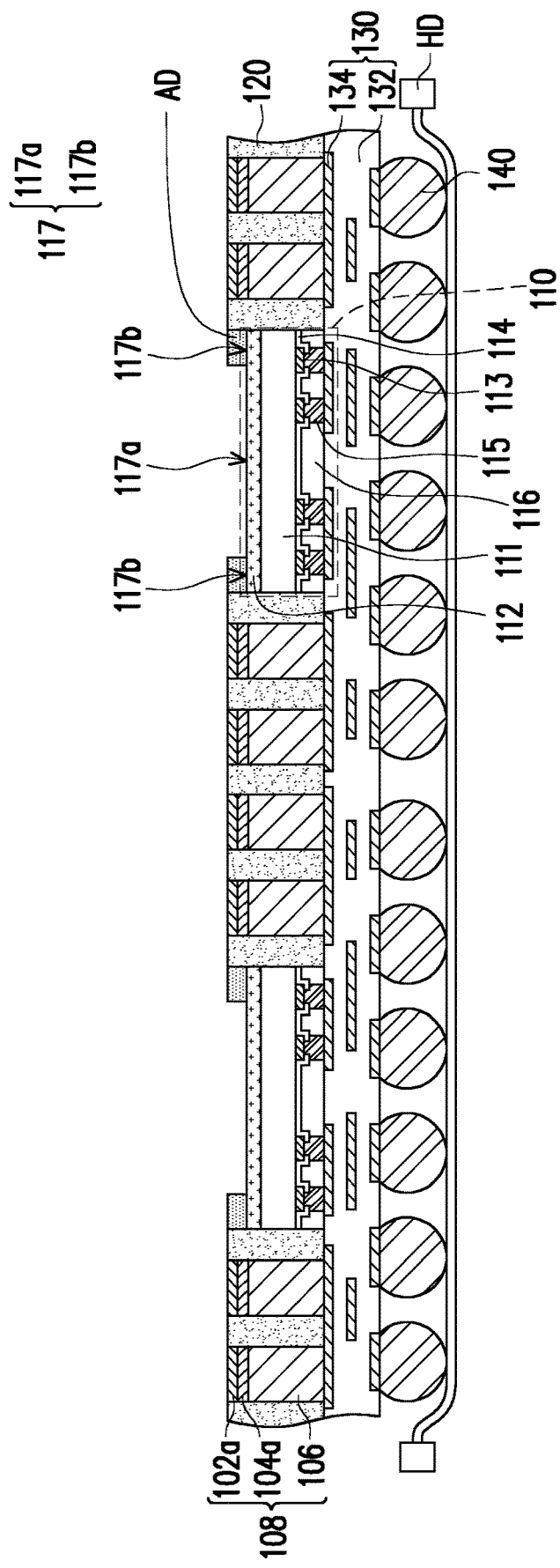

Referring to FIG. 1I, after removing the carrier C, the de-bonding layer DB is removed. For example, the de-bonding layer DB is removed by a dry etching process. The dry etching process uses $O_2$-based plasma, Ar-based plasma, $CF_4$-based plasma, $N_2$-based plasma, a combination thereof or other suitable plasma. After removing the de-bonding layer DB, the seed layer patterns 102a, the adhesive layer AD and the amorphous layer 112 are exposed.

Figure 1J:
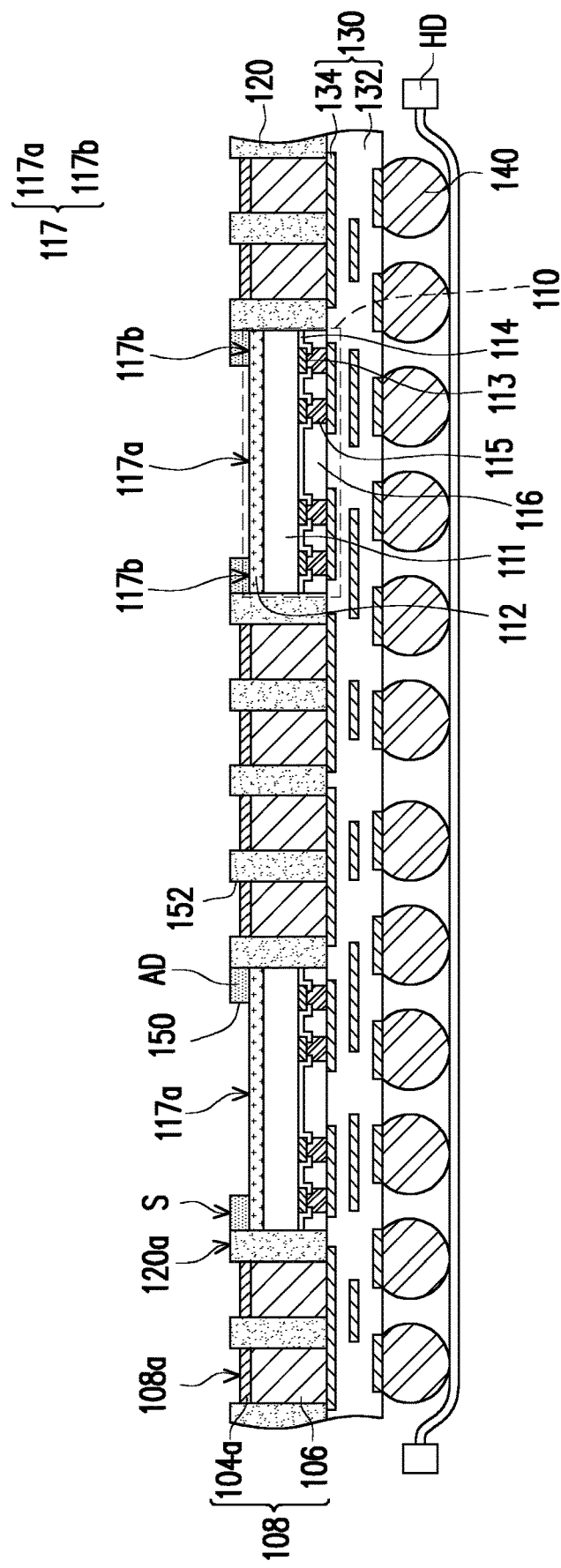

Referring to FIG. 1J, the seed layer patterns 102a are removed. For example, the seed layer patterns 102a are removed by a wet etching process. After removing the seed layer patterns 102a, the seed layer patterns 104a are exposed. In some embodiments, the de-bonding layer DB and the seed layer patterns 102a are separately removed. However, the invention is not limited thereto. In some alternative embodiments, the de-bonding layer DB and the seed layer patterns 102a may be removed by the same etching process such as a dry etching process.

In some embodiments, as shown in FIG. 1J, a surface S of the adhesive layer AD is substantially flush with a surface 120a of the encapsulant 120. The surface S of the adhesive layer AD is higher than the backside surface 117 of the semiconductor die 110 (i.e., the backside surface of the amorphous layer 112). Thus, a recess 150 is formed over the backside surface 117 of the amorphous layer 112 with respect to the surface S of the adhesive layer AD. The surface 120a of the encapsulant 120 is higher than a surface 108a of the conductive pillar 108. Accordingly, a recess 152 is formed over the surface 108a of the conductive pillar 108 with respect to the surface 120a of the encapsulant 120. In some embodiments, as shown in FIG. 2, the adhesive layer AD covers the peripheral region 117b of the backside surface 117 of the semiconductor die 110, and the central region 117a of the backside surface 117 of the semiconductor die 110 (i.e., the central region of the backside surface of the amorphous layer 112) is exposed.

Figure 1K:
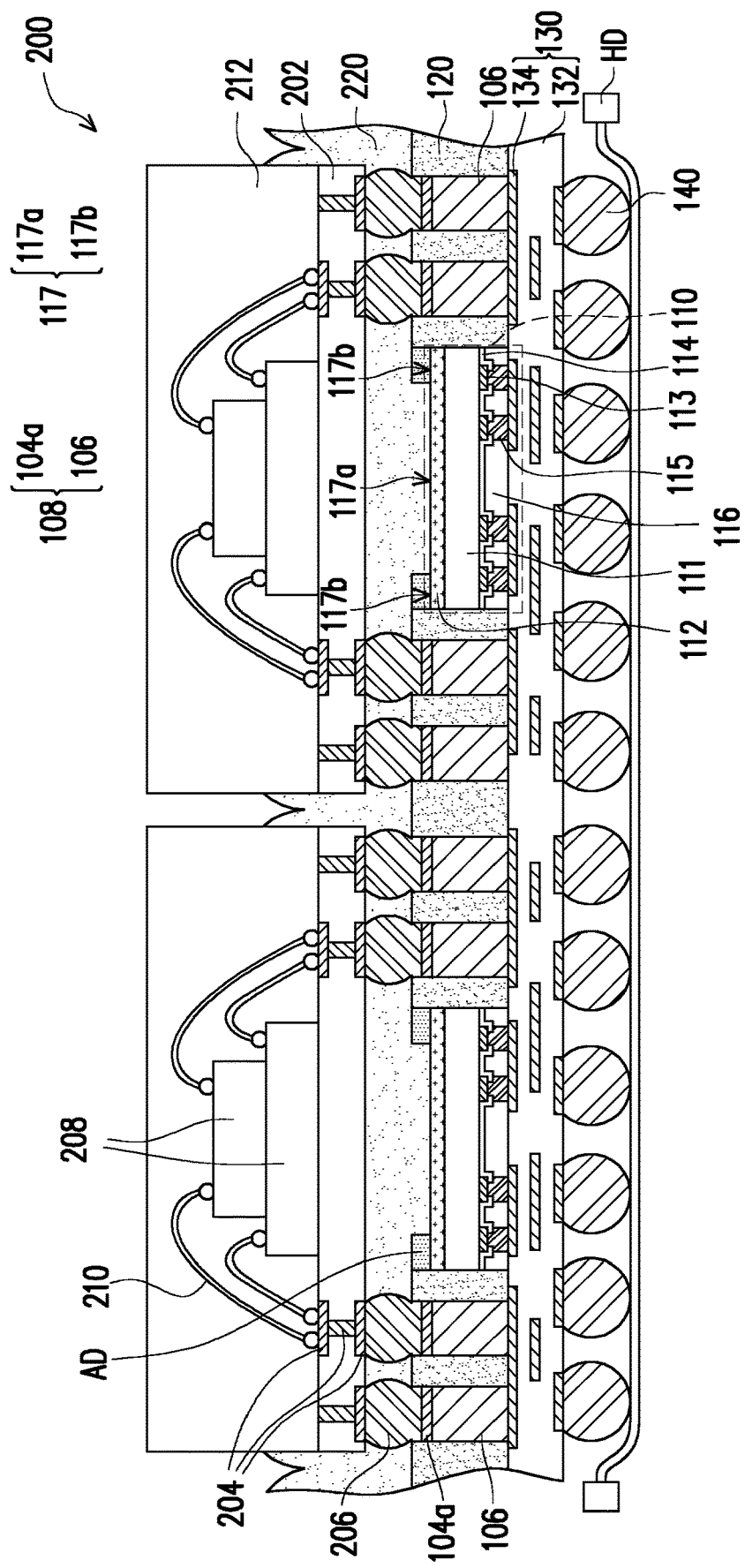

Referring to FIG. 1K, a semiconductor device 200 is stacked over and electrically connected to the semiconductor die 110 and the conductive pillars 108. In some embodiments, the semiconductor device 200 is a package such as a dynamic random access memory (DRAM) package or any other suitable semiconductor device. In some embodiments, the semiconductor device 200 is disposed over the semiconductor die 110 and the conductive pillars 108 aside the semiconductor die 110. In some embodiments, the semiconductor device 200 includes a substrate 202, a plurality of semiconductor dies 208 stacking on the substrate 202 and an encapsulant 212 on the substrate 202 to encapsulating the semiconductor dies 208. The substrate 202 includes a plurality of contacts 204 therein and a plurality of terminal connectors 206 thereon. The contacts 204 may be pads or metal posts on the pads. The contacts 204 are electrically connected to the redistribution circuit structure 130 through the terminal connectors 206 and the conductive pillars 108.

The terminal connector 206 is disposed between the contact 204 and the conductive pillar 108. In some embodiments, the terminal connector 206 is extended into the recess 152 (shown in FIG. 1J) to electrically connect the seed layer pattern 104a of the conductive pillar 108. For example, the recess 152 is filled with the terminal connector 206. The semiconductor dies 208 are mounted on the substrate 202 and electrically connected to the contacts 204 through bond wires 210. The encapsulant 212 is formed over the substrate 202 to cover the semiconductor dies 208 and the bond wires 210, so as to protect the semiconductor dies 208 and the bond wires 210 from the environment and external contaminants.

Then, an underfill 220 is formed between the semiconductor die 110 and the semiconductor device 200, between the encapsulant 120 and the semiconductor device 200 and between the terminal connectors 206. In some embodiments, the underfill 220 is formed on sidewalls of the encapsulant 212 and the substrate 202 and fills gaps between the first semiconductor die 110 and the substrate 202 and gaps between the encapsulant 120 and the substrate 202 aside the terminal connectors 206. In some embodiments, the underfill 220 is extended into the recess 150 (shown in FIG. 1J) and is in contact with the backside surface 117 of the semiconductor die 110. For example, the underfill 220 is in contact with the central region 117a of the backside surface 117 of the amorphous layer 112. In some embodiments, as shown in FIG. 1K, the underfill 220 is continuously formed between the semiconductor devices 200. However, the invention is not limited thereto. In some alternative embodiments, a plurality of underfills are formed to encapsulate the semiconductor devices 200 respectively.

Figure 1L:
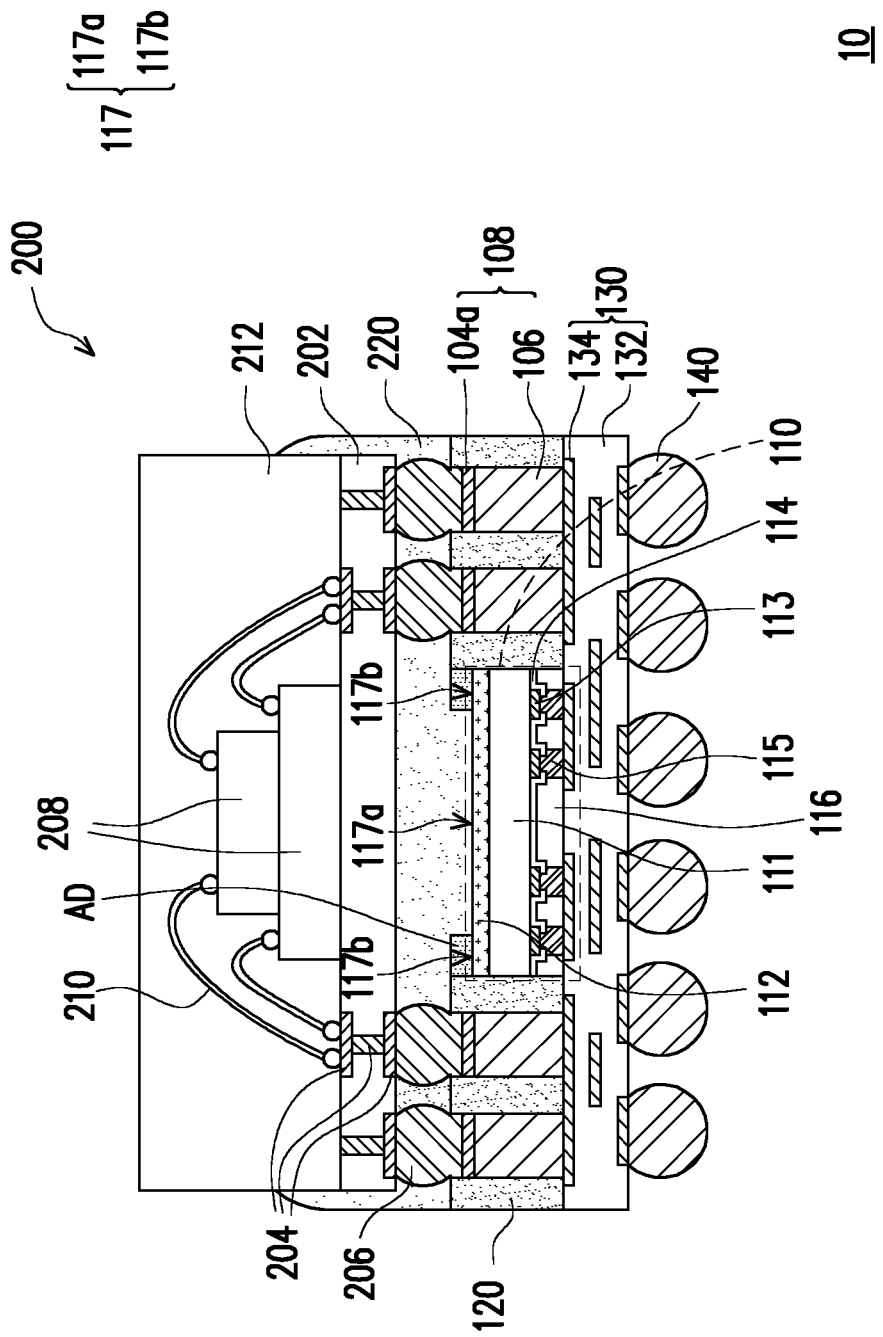

Referring to FIG. 1L, in some embodiments, a dicing process is performed to cut the whole package structure into individual and separated semiconductor package 10. For example, the dicing process is performed by cutting though the underfill 220, the encapsulant 120 and the redistribution circuit structure 130. The dicing process is a wafer dicing process including mechanical blade sawing or laser cutting. In some embodiments, the semiconductor package 10 is an integrated fan-out Package-on-Package (InFO PoP) device, for example. In some alternative embodiments, the semiconductor package 10 may be further mounted on an electronic device, the electronic device may be a board such as a printed circuit board (PCB), for example. In some alternative embodiments, the semiconductor package 10 may be mounted with additional packages, chips/dies or other electronic devices. In some embodiments, after cutting, a sidewall of the underfill 220 has a substantially vertical portion and a curved portion connecting the substantially vertical portion. However, the invention is not limited thereto. In some alternative embodiments, a sidewall of the underfill 220 is curved.

Conventionally, a die attach film (DAF) covers an entire backside surface of a die, and the heat dissipation of the die is significantly reduced due to the poor thermal conductivity of the DAF. In other words, the heat is easily accumulated in the die, and the application of the semiconductor package such as InFO-PoP is limited. Therefore, the removal of the DAF is required. However, removal process of the DAF such as dry etching process may remove the amorphous layer of the die at the same time. If the amorphous layer is removed, the substrate of the die is exposed and serious copper contamination to the substrate of the die and copper-in-fin issue may occur. On contrary, in some embodiments, the adhesive layer merely covers a portion (i.e., the peripheral region) of the backside surface of the semiconductor die, and other portions (i.e., the central region) of the backside surface are exposed. Accordingly, the heat generated by any component of the semiconductor die may be dissipated through the backside surface exposed by the adhesive layer. Therefore, there is no need to remove the adhesive layer for heat dissipation, and the damage to the amorphous layer of the semiconductor die due to the removal of the die attach film is prevented. The amorphous layer remains at the backside surface of the semiconductor die to protect the underlying substrate, and the copper contamination to the substrate and the copper-in-fin issue are prevented. In some embodiments, the semiconductor package has a good heat dissipation performance and has no copper contamination or copper-in-fin issue, and application of the semiconductor package is improved. In addition, a process window of cleaning the backside surface the semiconductor die is enlarged.

In some embodiments, an outer sidewall of the adhesive layer AD is substantially flush with a sidewall of the semiconductor die 110. However, the invention is not limited thereto. In some alternative embodiments, the adhesive layer AD is disposed at any location in the peripheral region 117b between the edge of the semiconductor die 110 and the central region 117a. In other words, a distance is formed between the edge of the semiconductor die 110 and the outer sidewall of the adhesive layer AD.

Figure 3:
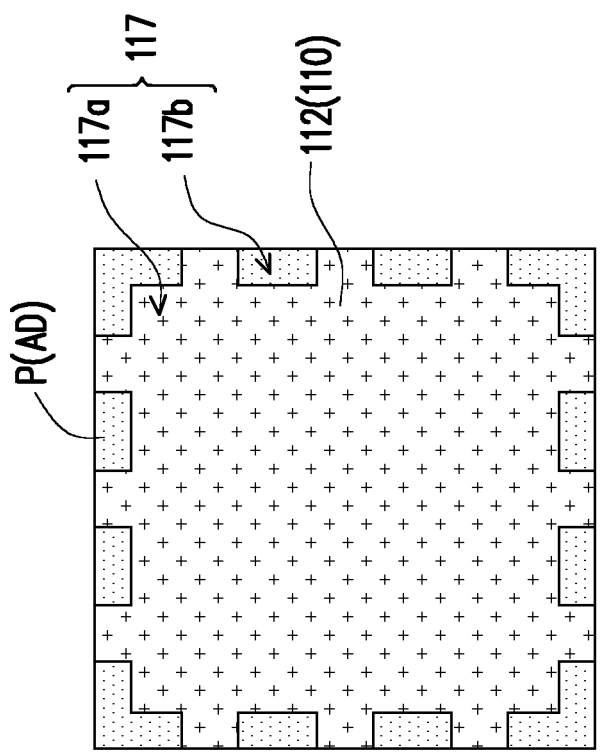
FIG. 3 is a simplified top view of an adhesive layer and a semiconductor die in a semiconductor package in accordance with some embodiments.

In some embodiments, as shown in FIG. 3, the adhesive layer AD may include a plurality of discrete patterns P. The patterns P are separated from each other, and the patterns P are arranged along one ring-shaped path to form as a ring shape. Each pattern P may be extended along at least portion of one side of the semiconductor die 110 or continuously extended along two adjacent sides of the semiconductor die 110. In some embodiments, the pattern P is a cuboid, for example. However, the invention is not limited thereto. In some alternative embodiments, the shape, the width, the height or the like of the pattern and the distance between the patterns may be changed according to the requirements.

FIG. 4A to FIG. 4F are schematic cross-sectional views of a method of forming a semiconductor package in accordance with some embodiments. FIG. 5 is a simplified top view of FIG. 4D. For simplicity and clarity of illustration, only few elements such an adhesive layer and a thermal conductive layer are shown. The method of FIGS. 4A to 4F is similar to the method of FIGS. 1A to 1L, hence the same reference numerals are used to refer to the same and liked parts, and its detailed description will be omitted herein. The difference is illustrated in details below.

Figure 4A:
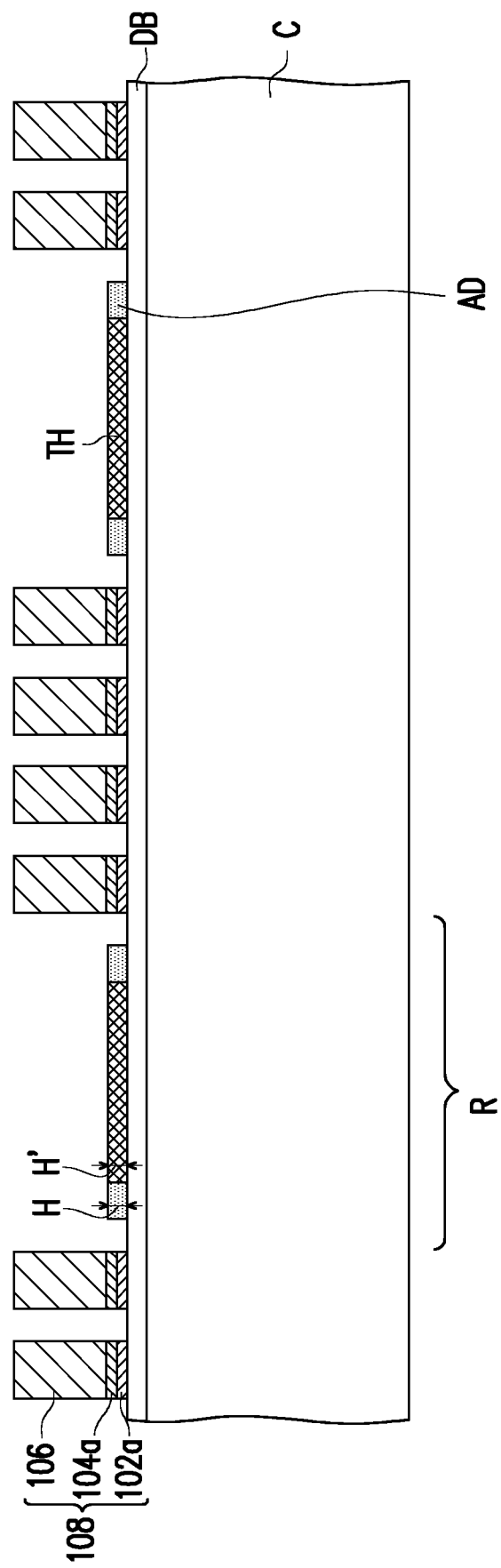
FIG. 4A to FIG. 4F are schematic cross-sectional views of a method of forming a semiconductor package in accordance with some embodiments.
Figure 5:
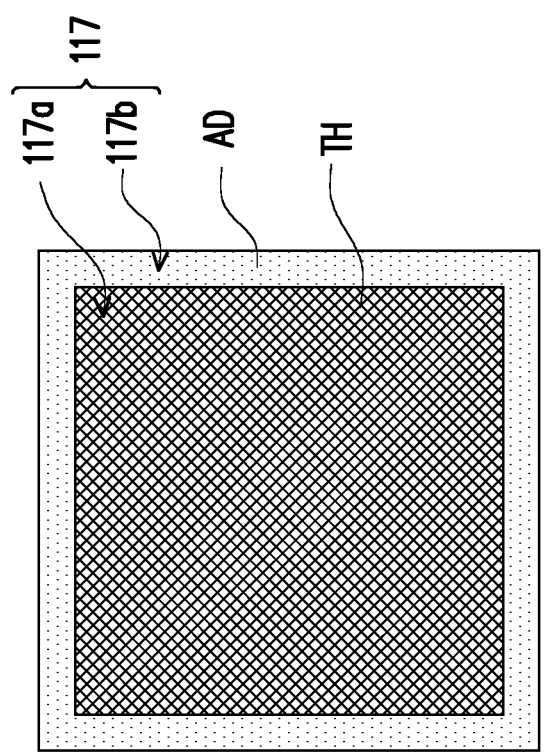
FIG. 5 is a simplified top view of FIG. 4D.

Referring to FIG. 4A, a plurality of conductive pillars 108 are formed on a debond layer DB over a carrier C, and a die region R is defined between the conductive pillars 108. Then, an adhesive layer AD and a thermal conductive layer TH are formed in the die region R. In some embodiments, the adhesive layer AD is disposed in a peripheral region of the die region R, and the thermal conductive layer TH is disposed in a central region of the die region R surrounded by the peripheral region. For example, a liquid material of the adhesive layer AD is dispensed on the debond layer DB along a rectangular-ring path (not shown), so as to form the ring-shaped adhesive layer AD. Then, a liquid material of the thermal conductive layer TH is dispensed by an inkjet printer or a dispenser on the debond layer DB exposed by the ring-shaped adhesive layer AD in the die region R. After dispensing, a heat process is performed to cure the liquid material of the thermal conductive layer TH. The thermal conductive layer TH is adhesive and has high thermal conductivity larger than 1 w/mK. A material of the thermal conductive layer TH is different from a material of the adhesive layer AD, and the material of the thermal conductive layer TH has a higher thermal conductivity than the material of the adhesive layer AD. For example, a thermal conductivity k of the adhesive layer AD is less than 1 w/mK, and a thermal conductivity k of the thermal conductive layer TH is larger than 3 w/mK. A material of the adhesive layer AD includes epoxy, polyimide, or the like. A material of the thermal conductive layer TH includes epoxy silica, polyimide, acrylic-based materials or the like. In some embodiments, the thermal conductive layer TH is in contact with the adhesive layer AD. In some embodiments, a height H' of the thermal conductive layer TH is substantially the same as or smaller than a height H of the adhesive layer AD. However, the invention is not limited thereto. In some alternative embodiments, the height of the thermal conductive layer TH is less than the height of the adhesive layer AD.

In some embodiments, as shown in FIG. 5, the adhesive layer AD has a rectangular-ring shape, and the thermal conductive layer TH has a rectangular shape. However, the invention is not limited thereto. In some alternative embodiments, the adhesive layer AD and the thermal conductive layer TH have other suitable shapes.

Figure 4B:
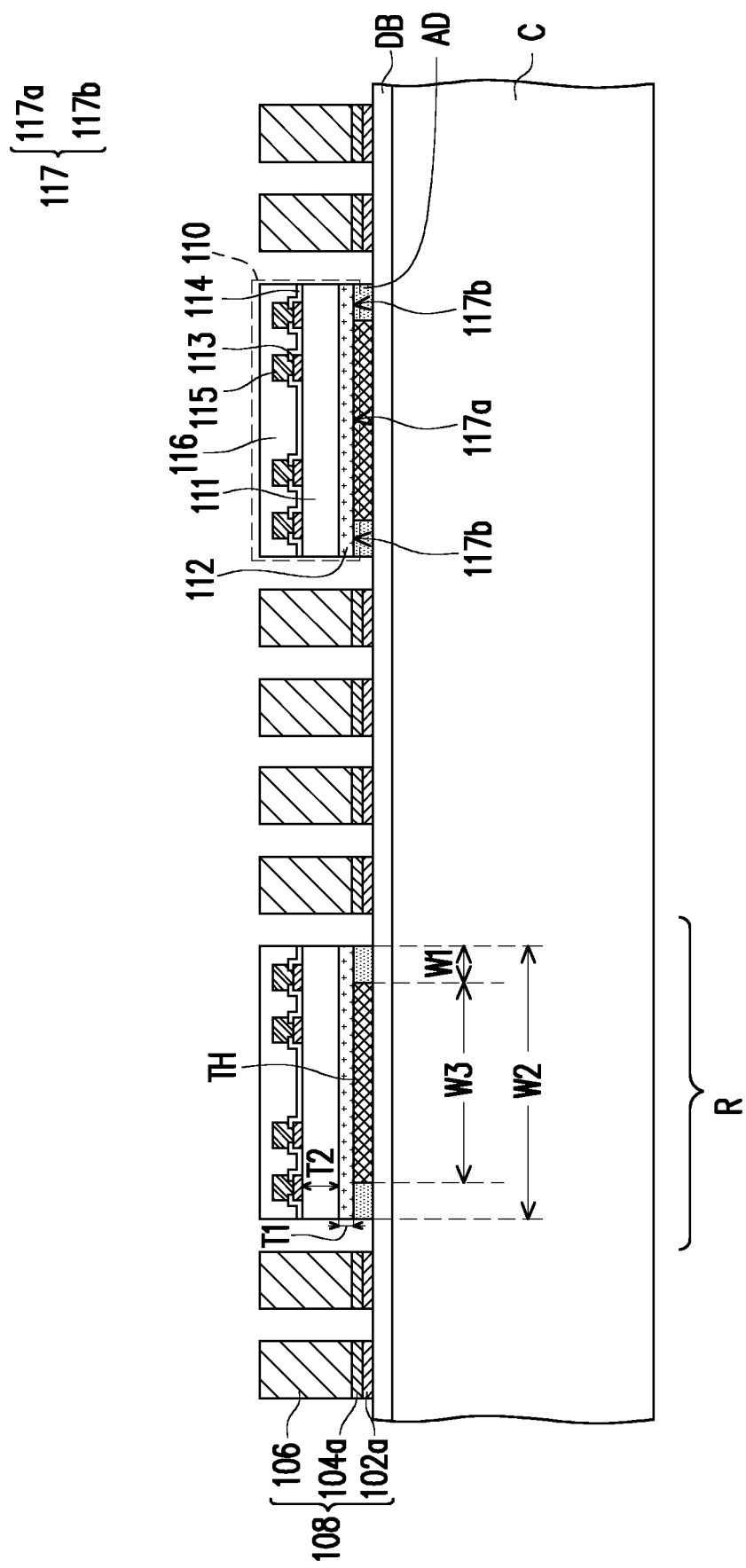

Referring to FIG. 4B, a semiconductor die 110 is placed on the adhesive layer AD and the thermal conductive layer TH in the die region R. The semiconductor die 110 is adhered to the carrier C through the adhesive layer AD. The semiconductor die 110 includes a substrate 111, an amorphous layer 112, a plurality of pads 113, a passivation layer 114, a plurality of metal posts 115 and a protection layer 116.

In some embodiments, since the height H of the adhesive layer AD is substantially the same as the height H' of the thermal conductive layer TH, a backside surface 117 of the semiconductor die 110 is in contact with the adhesive layer AD and the thermal conductive layer TH at the same time. For example, a central region 117a of the backside surface 117 is in contact with the thermal conductive layer TH, and a peripheral region 117b of the backside surface 117 die 110 is in contact with the adhesive layer AD. In some embodiments, an amorphous layer 112 is in contact with the adhesive layer AD and the thermal conductive layer TH. However, the invention is not limited thereto. In some alternative embodiments, the height of the thermal conductive layer TH is less than the height of the adhesive layer AD, after placing the semiconductor die 110 onto the adhesive layer AD, the adhesive layer AD may be slightly compressed and then the backside of the semiconductor die 110 will touch the thermal conductive layer TH.

In some embodiments, a width W1 of the adhesive layer AD is less than a width W2 of the semiconductor die 110, and a width W3 of the thermal conductive layer TH is less than the width W2 of the semiconductor die 110. In some embodiments, the width W1 is in a range of 2 µm to 5000 µm, and the width W3 is in a range of 2 µm to 14000 µm.

Figure 4C:
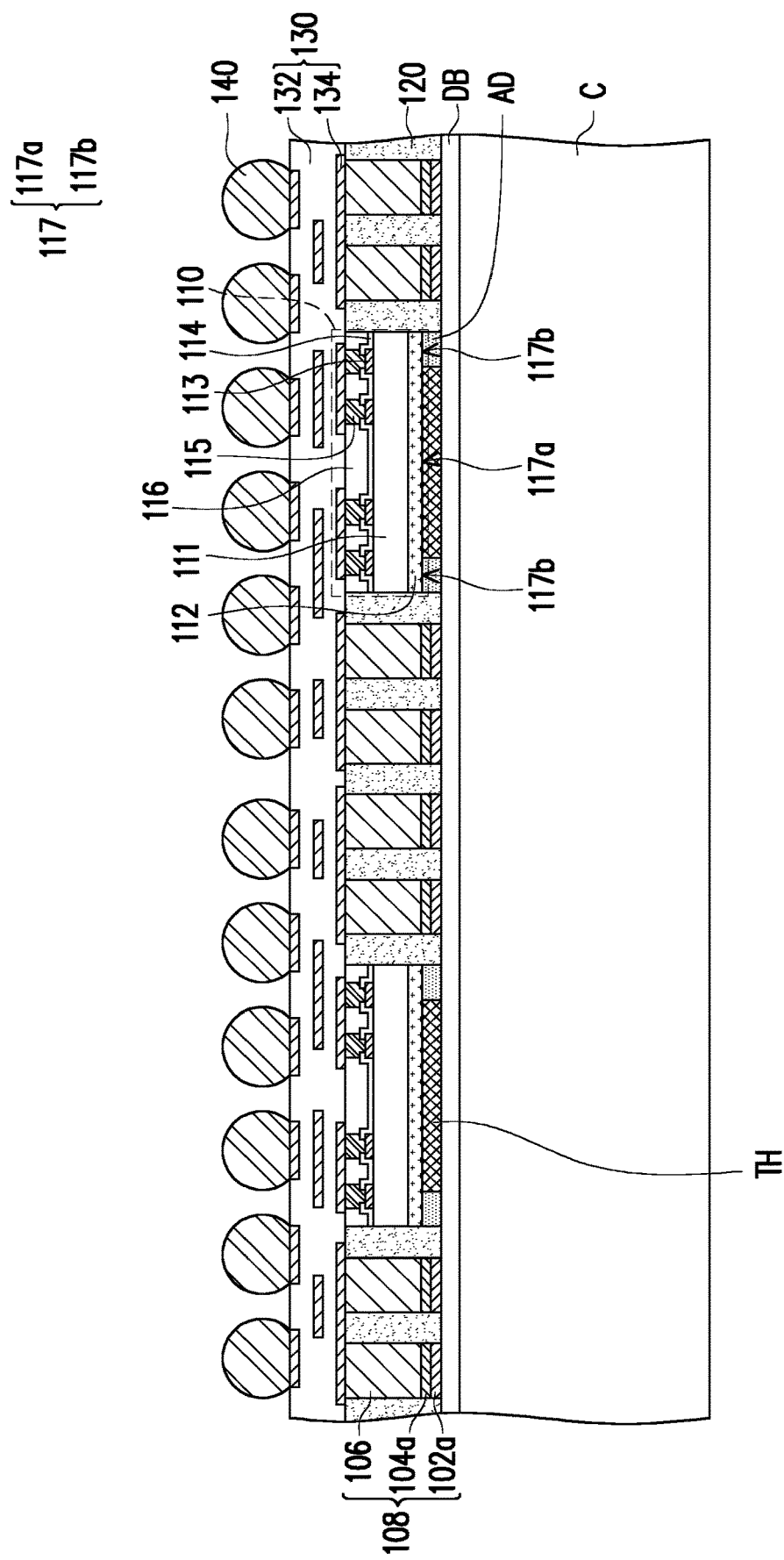

Referring to FIG. 4C, an encapsulant 120 is formed over the carrier C to encapsulate the semiconductor die 110 and the conductive pillars 108. Then, a redistribution circuit structure 130 and a plurality of terminal connectors 140 are sequentially formed over the encapsulant 120, to electrically connect to the semiconductor die 110 and the conductive pillars 108. In some embodiments, the redistribution circuit structure 130 includes a dielectric layer 132 and a plurality of redistribution patterns 134 in the dielectric layer 132.

Figure 4D:
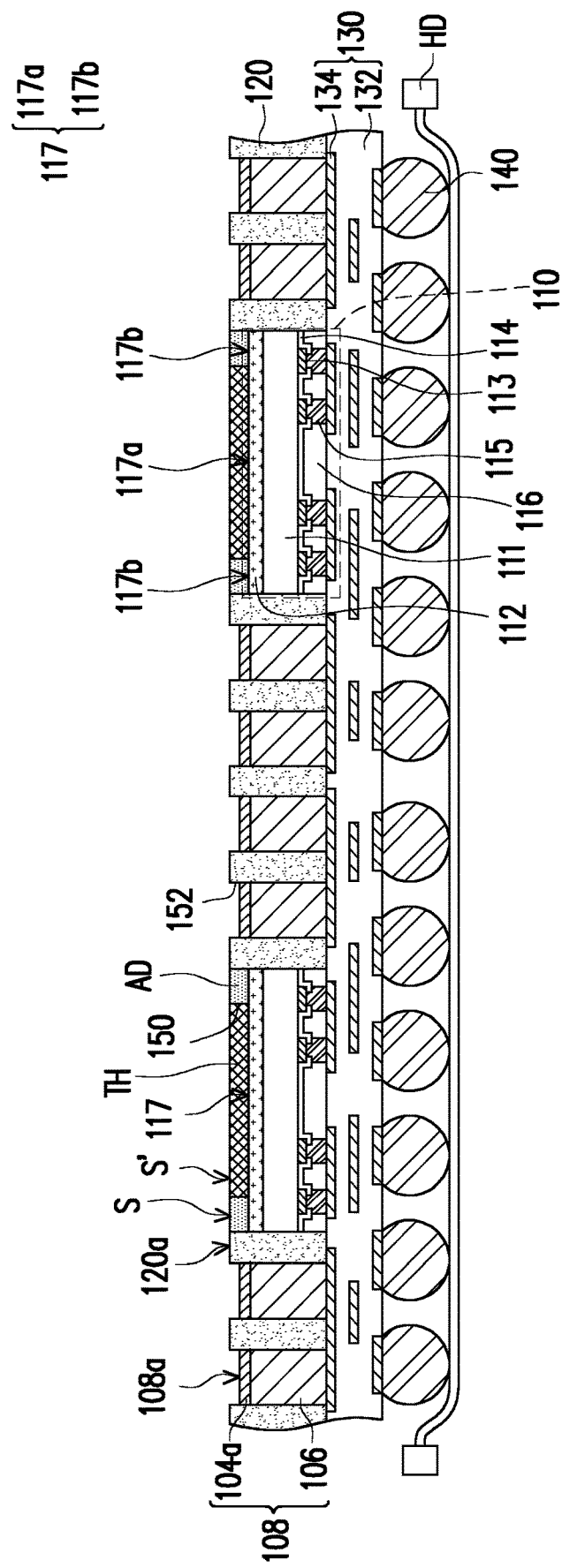

Referring to FIG. 4D, the structure shown in FIG. 4C is overturned (e.g., turned upside down) and placed on a holder HD, and the carrier C is detached and removed. Then, the de-bonding layer DB and the seed layer patterns 102a are removed. The de-bonding layer DB and the seed layer patterns 102a may be separately removed or simultaneously removed. In some embodiments, as shown in FIG. 4D, a surface S of the adhesive layer AD and a surface S' of the thermal conductive layer TH are substantially flush with a surface 120a of the encapsulant 120. A surface 108a of the conductive pillar 108a is lower than the surface 120a of the encapsulant 120, and thus a recess 152 is formed over the surface 108a of the conductive pillar 108. In some embodiments, as shown in FIG. 5, the adhesive layer AD covers the peripheral region 117b of the backside surface 117 of the semiconductor die 110, and the thermal conductive layer TH covers the central region 117a of the backside surface 117 of the semiconductor die 110.

Figure 4E:
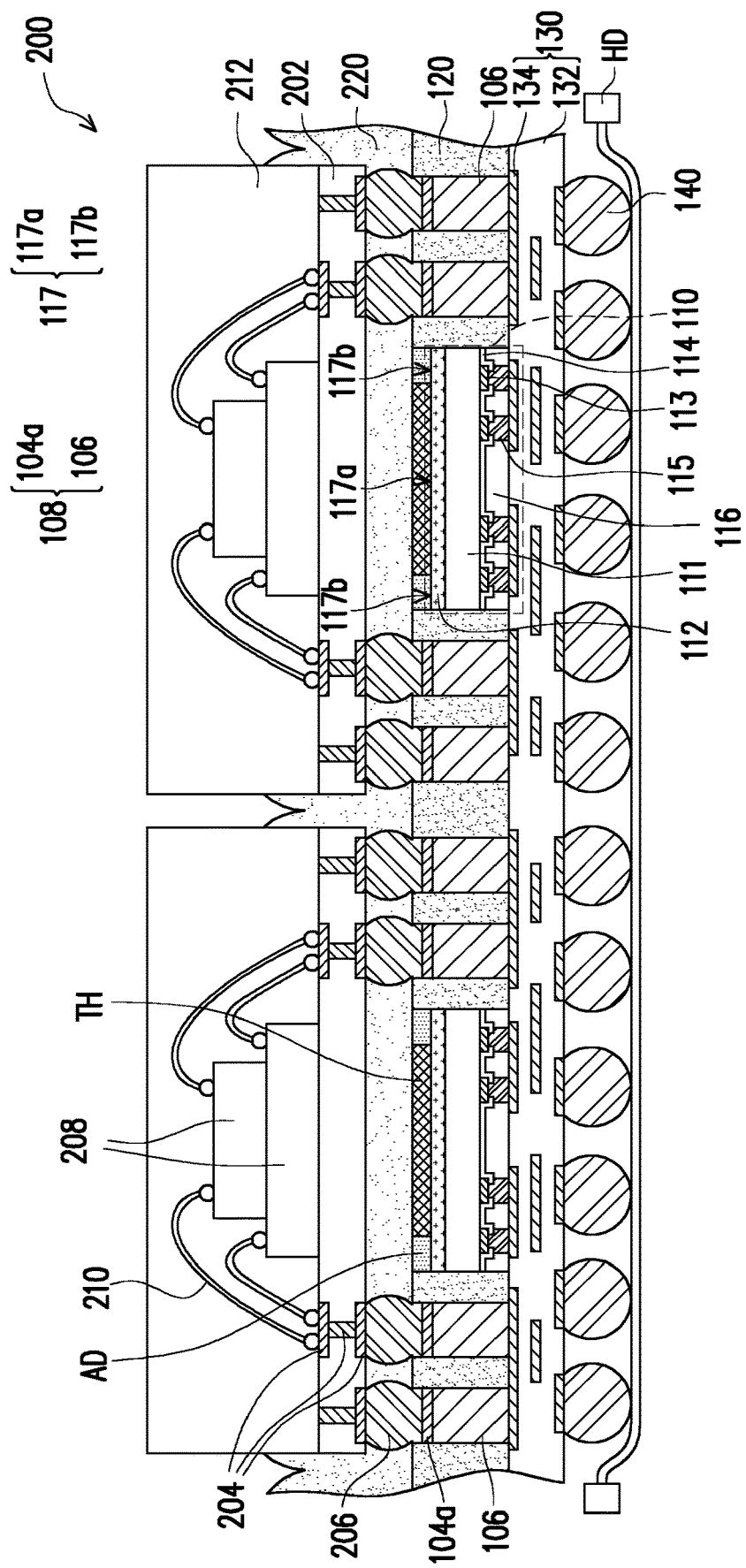

Referring to FIG. 4E, a semiconductor device 200 is stacked over and electrically connected to the semiconductor die 110 and the conductive pillars 108. In some embodiments, the semiconductor device 200 includes a substrate 202, a plurality of contacts 204 in the substrate 202, a plurality of terminal connectors 206 on a surface of the substrate 202, a plurality of semiconductor dies 208 stacking on the substrate 202, a plurality of bond wires 210 electrically connecting the semiconductor dies 208 and the contacts 204, and an encapsulant 212 encapsulating the semiconductor dies 208. Then, an underfill 220 is formed between the semiconductor die 110 and the semiconductor device 200. In some embodiments, the underfill 220 is in contact with the thermal conductive layer TH.

Figure 4F:
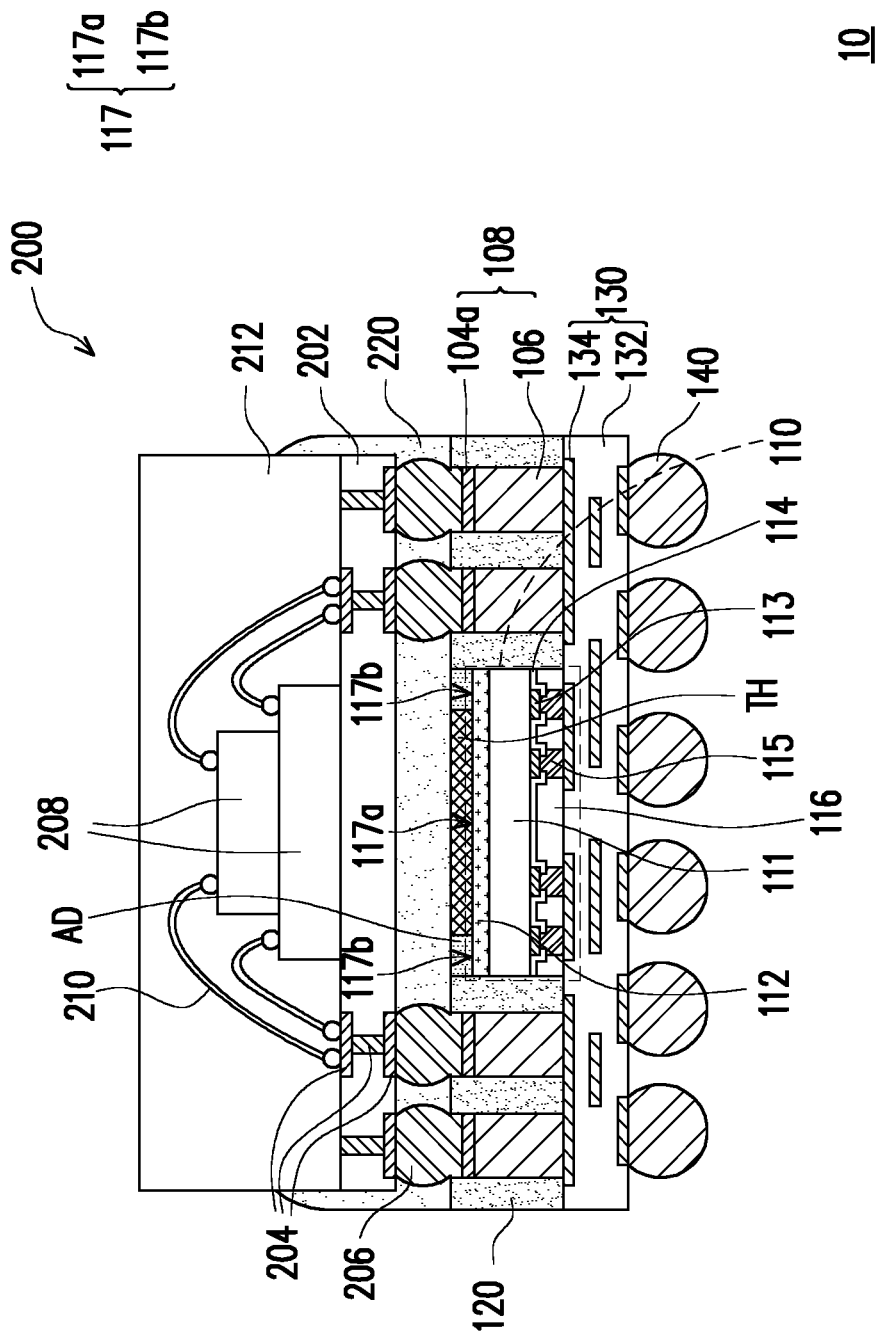

Referring to FIG. 4F, in some embodiments, a dicing process is performed to cut the whole package structure into individual and separated semiconductor packages 10A. In some embodiments, as shown in FIGS. 4F and 5, the adhesive layer AD merely occupies the peripheral region 117b of the backside surface 117 of the semiconductor die 110, and the central region 117a of the backside surface 117 of the semiconductor die 110 is in contact with the thermal conductive layer TH having a high conductivity. Therefore, the heat generated by any component of the semiconductor die may be dissipated through the thermal conductive layer. Accordingly, there is no need to remove the adhesive layer for heat dissipation, and the damage to the amorphous layer of the semiconductor die due to the removal of the die attach film is prevented. The amorphous layer remains at the backside surface of the semiconductor die to protect the underlying substrate, and the copper contamination to the substrate and the copper-in-fin issue are prevented. In some embodiments, the semiconductor package has a good heat dissipation performance and has no copper contamination or copper-in-fin issue, and application of the semiconductor package is improved. In addition, a process window of cleaning the backside surface the semiconductor die is enlarged.

Figure 6:
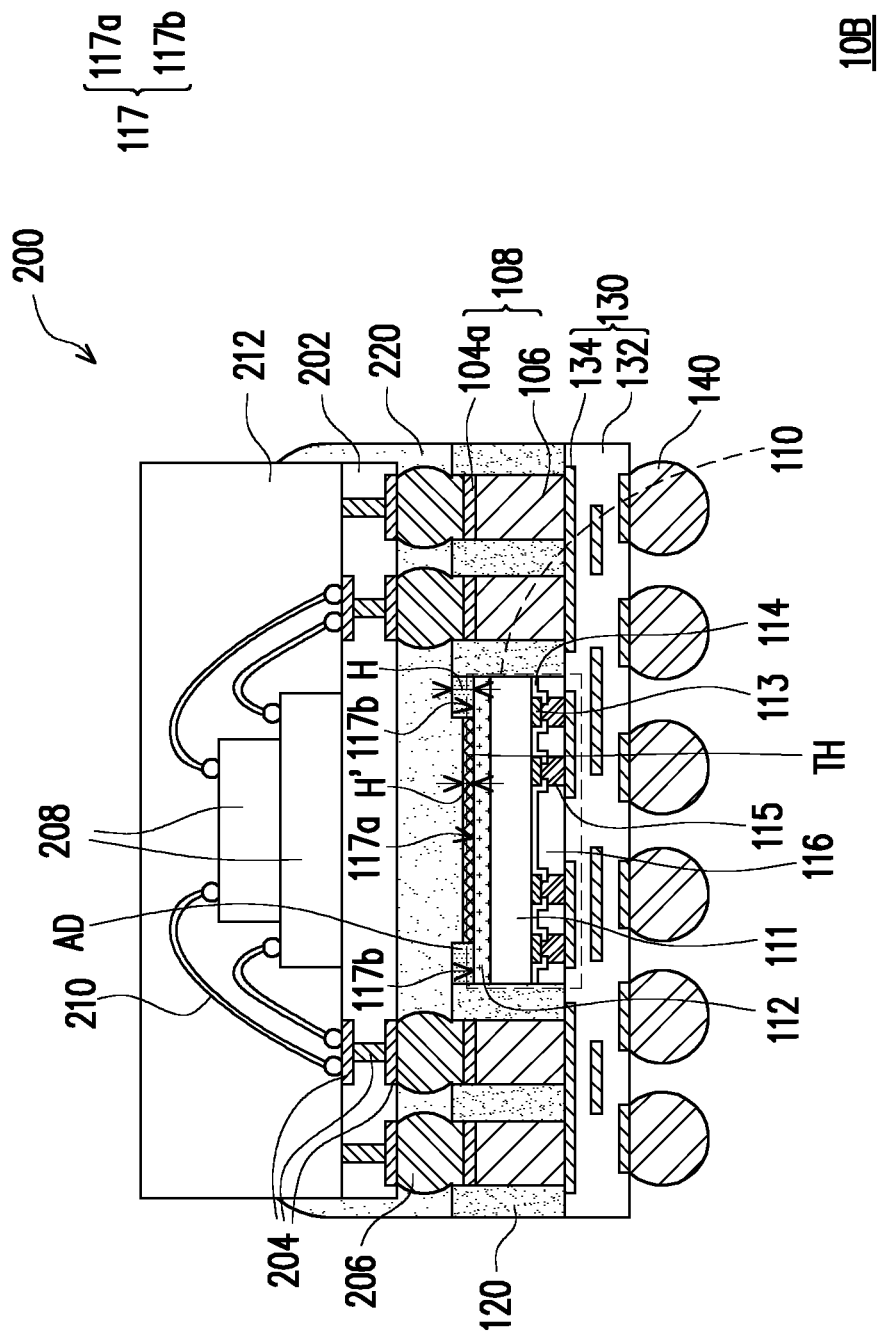
FIG. 6 is a schematic cross-sectional view of a semiconductor package in accordance with some embodiments.

In some embodiments, as shown in FIG. 4F, the height H' of the thermal conductive layer TH is substantially the same as the height H of the adhesive layer AD. However, the invention is not limited thereto. In some alternative embodiments, as shown in FIG. 6, in a semiconductor package 10B, the height H' of the thermal conductive layer TH is less than the height H of the adhesive layer AD.

According to some embodiments, a semiconductor package includes a first semiconductor die, an adhesive layer, a second semiconductor die and an underfill. The first semiconductor die includes a first surface, and the first surface includes a central region and a peripheral region surrounding the central region. The adhesive layer is adhered to the peripheral region and exposes the central region. The second semiconductor die is stacked over the first surface of the first semiconductor die. The underfill is disposed between the first semiconductor die and the second semiconductor die.

According to some embodiments, a semiconductor package includes a first semiconductor die, a die attach film, a thermal conductive layer and a semiconductor device. The first semiconductor die includes a backside surface. The die attach film is in contact with a first portion of the backside surface. The thermal conductive layer is in contact with a second portion of the backside surface and has a thermal conductivity higher than the die attach film. The semiconductor device is stacked over the first surface of the first semiconductor die The die attach film and the thermal conductive layer are disposed between the first semiconductor die and the semiconductor device.

According to some embodiments, a method of forming a semiconductor package includes the following steps. An adhesive layer is dispensed over a carrier. A first semiconductor die is placed on the adhesive layer. The adhesive layer is in contact with a peripheral region of a backside surface of the first semiconductor die, and the adhesive layer exposes a central region surrounded by the peripheral region of the backside surface of the first semiconductor die. The carrier is detached from the first semiconductor die. A semiconductor device is placed over the first semiconductor die with the die attach film therebetween. An underfill is formed between the semiconductor device and the first semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a first semiconductor die comprising a first surface, the first surface having a central region and a peripheral region surrounding the central region;
   an adhesive layer adhered to the peripheral region and exposing the central region;
   a second semiconductor die, stacked over the first surface of the first semiconductor die;
   a plurality of conductive pillars, wherein the conductive pillars surround outer sidewalls of the first semiconductor die and electrically connect the first semiconductor die and the second semiconductor die;
   an underfill between the first semiconductor die and the second semiconductor die; and
   an encapsulant encapsulating the first semiconductor die and the conductive pillars, wherein a top surface of the encapsulant is substantially flush with a top surface of the adhesive layer and higher than top surfaces of the conductive pillars.

2. The semiconductor package of claim 1, wherein the underfill is in contact with the central region of the first surface.

3. The semiconductor package of claim 1, wherein the first semiconductor die comprises a substrate and an amorphous layer on the substrate, the first surface is a surface of the amorphous layer.

4. The semiconductor package of claim 1, wherein the adhesive layer has a ring shape.

5. The semiconductor package of claim 1, wherein the adhesive layer comprises a plurality of discrete patterns at each side of the peripheral region.

6. A semiconductor package, comprising:
   a first semiconductor die comprising a first surface;
   a die attach film, in contact with a first portion of the first surface;
   a thermal conductive adhesive layer, in contact with a second portion of the first surface and having a thermal conductivity higher than the die attach film;
   a semiconductor device, stacked over the first surface of the first semiconductor die, wherein the die attach film is in direct contact with the thermal conductive adhesive layer;
   an encapsulant, encapsulating the first semiconductor die; and
   an underfill between the first semiconductor die and the semiconductor device, wherein surfaces of the die attach film, the thermal conductive adhesive layer and the encapsulant are substantially coplanar with one another and are in direct contact with the underfill.

7. The semiconductor package of claim 6, wherein the first semiconductor die comprises a substrate and an amorphous layer between the substrate and the semiconductor device, and the thermal conductive adhesive layer is disposed between the semiconductor device and the amorphous layer.

8. The semiconductor package of claim 6, further comprising a conductive pillar aside the first semiconductor die, wherein the conductive pillar comprises a seed layer pattern and a conductive pattern, wherein a surface of the seed layer pattern is lower than a surface of the die attach film.

9. The semiconductor package of claim 6, wherein the second portion is surrounded by the first portion, and the thermal conductive adhesive layer is ring-shaped.

10. A method of forming a semiconductor package, comprising:
    forming a plurality of conductive pillars over a carrier;
    dispensing an adhesive layer aside the conductive pillars;
    placing a first semiconductor die on the adhesive layer, wherein the adhesive layer is in contact with a peripheral region of first surface of the first semiconductor die, and the adhesive layer exposes a central region surrounded by the peripheral region of the first surface of the first semiconductor die;
    forming an encapsulant to encapsulate the first semiconductor die and the conductive pillars, wherein a top surface of the encapsulant is substantially flush with a top surface of the adhesive layer and higher than top surfaces of the conductive pillars;
    placing a second semiconductor die over the first surface of the first semiconductor die with the die attach film therebetween, wherein the conductive pillars surround outer sidewalls of the first semiconductor die and electrically connect the first semiconductor die and the second semiconductor die; and
    forming an underfill between the second semiconductor die and the first semiconductor die.

11. The method of claim 10, wherein the adhesive layer is dispensed to have a ring shape.

12. The method of claim 10, wherein the adhesive layer comprises a plurality of discrete patterns, and the discrete patterns are arranged as a ring.

13. The method of claim 10, wherein the underfill is in contact with the central region of the first surface of the first semiconductor die.

14. The method of claim 10, before placing the first semiconductor die, further comprising dispensing a thermal conductive layer, wherein the adhesive layer surrounds the thermal conductive layer.

15. The method of claim 14, wherein the underfill is in contact with the adhesive layer and the thermal conductive layer.

16. The method of claim 10, wherein the adhesive layer is dispensed in a region surrounded by the conductive pillars.

17. The semiconductor package of claim 6, wherein the semiconductor device has a second surface facing the first surface of first semiconductor die, and a projection of the die attach film onto the first surface of the first semiconductor die is at least partially overlapped with a projection of the second surface of the semiconductor device onto the first surface of the first semiconductor die.

18. The semiconductor package of claim 6, further comprising a plurality of through vias penetrating through the encapsulant, wherein the surfaces of the die attach film, the thermal conductive adhesive layer and the encapsulant are top surfaces, and the surfaces of the die attach film, the thermal conductive adhesive layer and the encapsulant are higher than top surfaces of the conductive pillars.

19. The semiconductor package of claim 18, wherein bottom surfaces of the through vias are substantially coplanar with a second surface opposite to the first surface of the first semiconductor die.

20. The semiconductor package of claim 6, wherein a material of the thermal conductive adhesive layer includes epoxy silica, polyimide or acrylic-based material.

* * * * *